United States Patent
Takahashi (10) Patent No.: US 11,895,742 B2
(45) Date of Patent: Feb. 6, 2024

(54) CERAMIC HEATER

(71) Applicant: NGK INSULATORS, LTD., Nagoya (JP)

(72) Inventor: Tomohiro Takahashi, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 351 days.

(21) Appl. No.: 17/208,095

(22) Filed: Mar. 22, 2021

(65) Prior Publication Data

US 2021/0212172 A1 Jul. 8, 2021

Related U.S. Application Data

(63) Continuation of application No. PCT/JP2019/048313, filed on Dec. 10, 2019.

(30) Foreign Application Priority Data

Dec. 20, 2018 (JP) .................... 2018-238225

(51) Int. Cl.
*H05B 3/14* (2006.01)
*H01L 21/02* (2006.01)

(52) U.S. Cl.
CPC ............. *H05B 3/143* (2013.01); *H01L 21/02* (2013.01)

(58) Field of Classification Search
CPC . H01L 21/02; G01K 1/14; G01K 7/02; G01K 7/04; H05B 1/0233;
(Continued)

(56) References Cited

U.S. PATENT DOCUMENTS

2012/0211933 A1   8/2012 Goto
2016/0002779 A1*  1/2016 Lin ................... H01J 37/32724
                                                      118/500
(Continued)

FOREIGN PATENT DOCUMENTS

JP      3156031 U    12/2009
JP   2012-080103 A1   4/2012
(Continued)

OTHER PUBLICATIONS

International Search Report and Written Opinion (Application No. PCT/JP2019/048313 dated Mar. 3, 2020.
(Continued)

*Primary Examiner* — Sang Y Paik
(74) *Attorney, Agent, or Firm* — BURR PATENT LAW, PLLC (57) ABSTRACT

A ceramic heater includes a ceramic plate in which inner circumferential side and outer circumferential side resistance heating elements are built in; and a cylindrical shaft joined to a rear surface of the ceramic plate. A long hole is provided along a direction deviated from the diameter direction of the ceramic plate, and extends from a start point of a shaft inside area to a terminal position of the outer circumferential portion of the ceramic plate. A portion of the long hole forms a long groove, the portion passing through the shaft inside area. Terminals of the resistance heating elements are collectively provided in one of two division areas which are in the shaft inside area and divided by an axial line of the long groove, the one being a first division area having a larger area.

10 Claims, 9 Drawing Sheets

(58) Field of Classification Search
CPC ........ H05B 2203/003; H05B 2203/005; H05B 2203/016; H05B 3/02; H05B 3/143; H05B 3/283; H05B 3/74
USPC .......................................... 219/443.1–444.1
See application file for complete search history.

(56) References Cited

U.S. PATENT DOCUMENTS

| | | | |
|---|---|---|---|
| 2019/0252162 A1* | 8/2019 | Ma | .................... C23C 16/4581 |
| 2019/0355556 A1 | 11/2019 | Takahashi | |

FOREIGN PATENT DOCUMENTS

| | | |
|---|---|---|
| JP | 2012-160368 A1 | 8/2012 |
| WO | 2012/039453 A1 | 3/2012 |
| WO | 2018/163935 A1 | 9/2018 |

OTHER PUBLICATIONS

English translation of the International Preliminary Report on Patentability (Chapter I) dated Jul. 1, 2021 (Application No. PCT/JP2019/048313).

\* cited by examiner

CERAMIC HEATER

BACKGROUND OF THE INVENTION

1. Field of the Invention

The present invention relates to a ceramic heater.

2. Description of the Related Art

Figure 10:
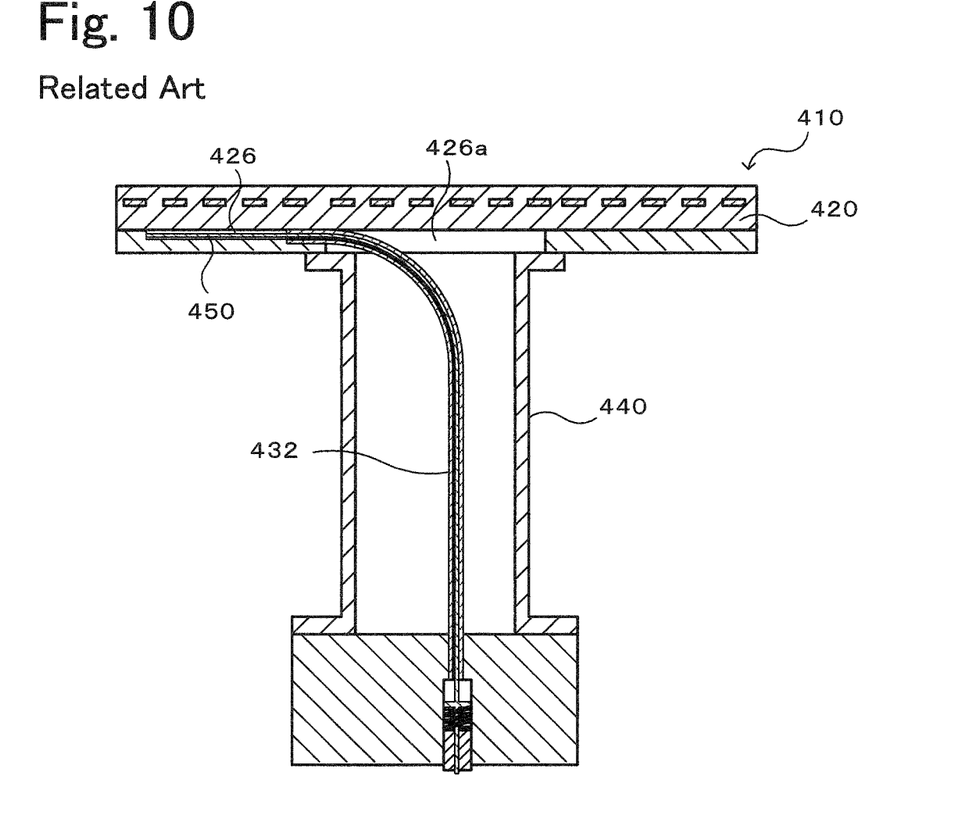
FIG. 10 is an explanatory view of a conventional example.

From the past, a ceramic heater called 2-zone heater has been known, in which resistance heating elements are independently embedded in respectively the inner circumferential side and the outer circumferential side of a disc-shaped ceramic plate having a wafer mounting surface. For instance, PTL 1 discloses a ceramic heater 410 having a shaft illustrated in FIG. 10. The ceramic heater 410 having a shaft measures the temperature on the outer circumferential side of a ceramic plate 420 by an outer circumferential side thermocouple 450. A thermocouple guide 432 is a cylindrical member, which extends straight upward from a lower position internally of a straight shaft 440, then is bent in an arc shape and changes its direction 90°. The thermocouple guide 432 is attached to a slit 426*a* provided in the area which is of the rear surface of the ceramic plate 420 and surrounded by the straight shaft 440. The slit 426*a* forms an entrance portion of a thermocouple path 426, and is provided along the diameter direction of the ceramic plate 420 in an area (shaft inside area) of the rear surface of the ceramic plate 420, the area being surrounded by the shaft 440. The outer circumferential side thermocouple 450 is inserted in the cylinder of the thermocouple guide 432, and reaches the terminal position of the thermocouple path 426.

CITATION LIST

Patent Literature

PTL 1: WO 2012/039453 A1 (FIG. 11)

SUMMARY OF THE INVENTION

In the ceramic heater 410, however, the shaft inside area is divided into two division areas having substantially the same area by the slit 426*a*, thus when multiple terminals are attempted to be collectively arranged in one of the division areas, the degree of freedom of the arrangement may be restricted.

The present invention has been devised to solve such a problem, and it is a primary object to collectively arrange multiple terminals in a multi-zone heater and increase the degree of freedom of the arrangement.

A ceramic heater of the present invention comprises:

a disc-shaped ceramic plate having a wafer mounting surface;

a cylindrical shaft connected to a rear surface of the ceramic plate, the rear surface being on an opposite side of the wafer mounting surface;

an inner circumferential side resistance heating element which is embedded in an inner circumferential portion of the ceramic plate;

an outer circumferential side resistance heating element which is embedded in an outer circumferential portion of the ceramic plate;

a shaft inside area which is below the rear surface of the ceramic plate and inside of the cylindrical shaft;

a long hole which is provided along a direction deviated from a diameter direction of the ceramic plate and extends from the shaft inside area to a predetermined position of the outer circumferential portion of the ceramic plate; and attached components which are provided in the shaft inside area and includes a pair of terminals of the inner circumferential side resistance heating element and a pair of terminals of the outer circumferential side resistance heating element, wherein a portion of the long hole forms a long groove, the portion passing through the shaft inside area, and the attached components are collectively provided in one of two division areas which are in the shaft inside area and divided by an axial line of the long groove, the one having a larger area.

In the ceramic heater, the attached components including a pair of terminals of the inner circumferential side resistance heating element and a pair of terminals of the outer circumferential side resistance heating element are provided in the shaft inside area of the rear surface of the ceramic plate. The long hole is provided along a direction deviated from the diameter direction of the ceramic plate, and extends from the shaft inside area to a predetermined position of the outer circumferential portion of the ceramic plate. A portion of the long hole forms a long groove, the portion passing through the shaft inside area. The two division areas of the shaft inside area are divided by an axial line (which is the same as the axial line of the long hole, and is a line in a direction deviated from the diameter direction of the ceramic plate) of the long groove. Thus, one of the two division areas is greater in area than the other. Here, the attached components are collectively provided in the division area having a larger area. Therefore, in a multi-zone heater, it is possible to collectively arrange the attached components including multiple terminals, and increase the degree of freedom of the arrangement. It is to be noted that wires from the attached components to an external device are easily bundled by collectively providing the attached components.

In the ceramic heater of the present invention, of the attached components, any attached components other than the terminals of the inner circumferential side and outer circumferential side resistance heating elements may be not present in the area surrounded by the terminals of the inner circumferential side and outer circumferential side resistance heating elements. In addition, each of the attached components may be arranged at a position where an electrical insulating property can be maintained. Since the attached components are collectively provided in the division area having a larger area, multiple terminals included in the attached components can be easily arranged at positions where an electrical insulating property can be maintained.

In the ceramic heater of the present invention, the long hole may be a thermocouple insertion long hole in which a thermocouple is inserted. Thus, a thermocouple can be inserted utilizing the long hole.

In the ceramic heater of the present invention, the long groove may be used to arrange a cylindrical thermocouple guide including a curved portion which changes its direction from a vertical direction to a horizontal direction with respect to the wafer mounting surface. In this manner, it is possible to collectively arrange the multiple terminals and increase the degree of freedom of the arrangement in a multi-zone heater to which a thermocouple guide can be attached.

It is to be noted that "vertical" includes substantially vertical (for instance, within a range of tolerance) in addition to completely vertical. The same applies to "horizontal".

In the ceramic heater of the present invention, the length of the long groove may be set longer than or equal to the length of the leading portion, arranged in the long groove, of the curved portion of the thermocouple guide. Therefore, the thermocouple guide can be set more easily.

In the ceramic heater of the present invention, the outer diameter of the curved portion of the thermocouple guide may be smaller than the outer diameter of the vertical portion. Thus, the width of the long groove can be reduced.

The ceramic heater of the present invention may include the thermocouple guide arranged in the long groove, and in addition, may include a thermocouple which is inserted in the thermocouple guide and the long hole. When the thermocouple is included, a temperature sensing part of the thermocouple may be arranged to fall within the width of the outer circumferential side resistance heating element when viewed from the rear surface of the ceramic plate. In this manner, a temperature change in the outer circumferential side resistance heating element can be detected with a good response by the temperature sensing part of the outer circumferential side thermocouple.

In the ceramic heater of the present invention, the gap between the long groove and each of the attached components may be 2 mm or greater. In this manner, it is possible to prevent the occurrence of crack in the ceramic plate due to a narrow gap between the long groove and each of the attached components.

DETAILED DESCRIPTION OF THE INVENTION

Figure 1:
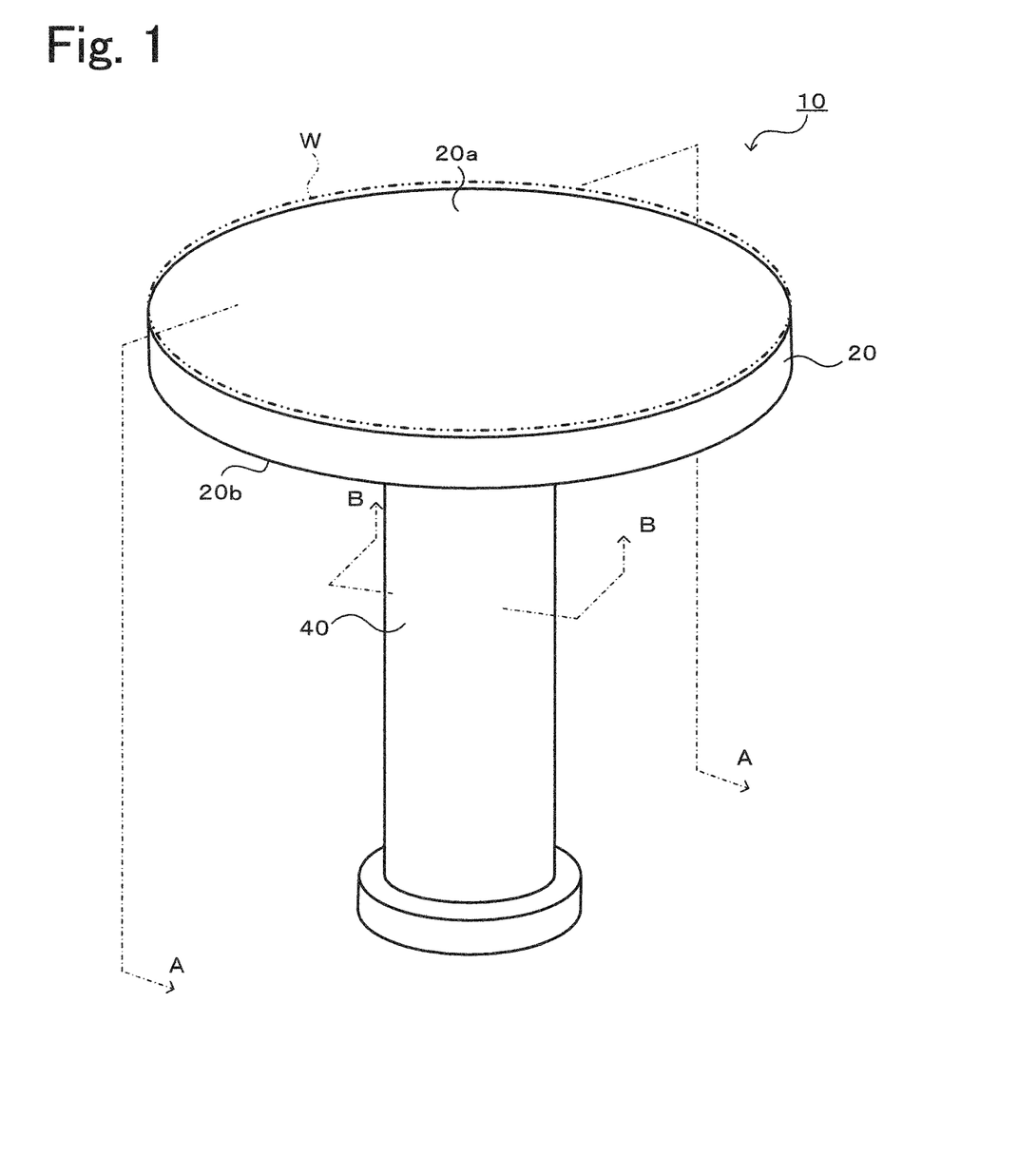
FIG. 1 is a perspective view of a ceramic heater 10.
Figure 2:
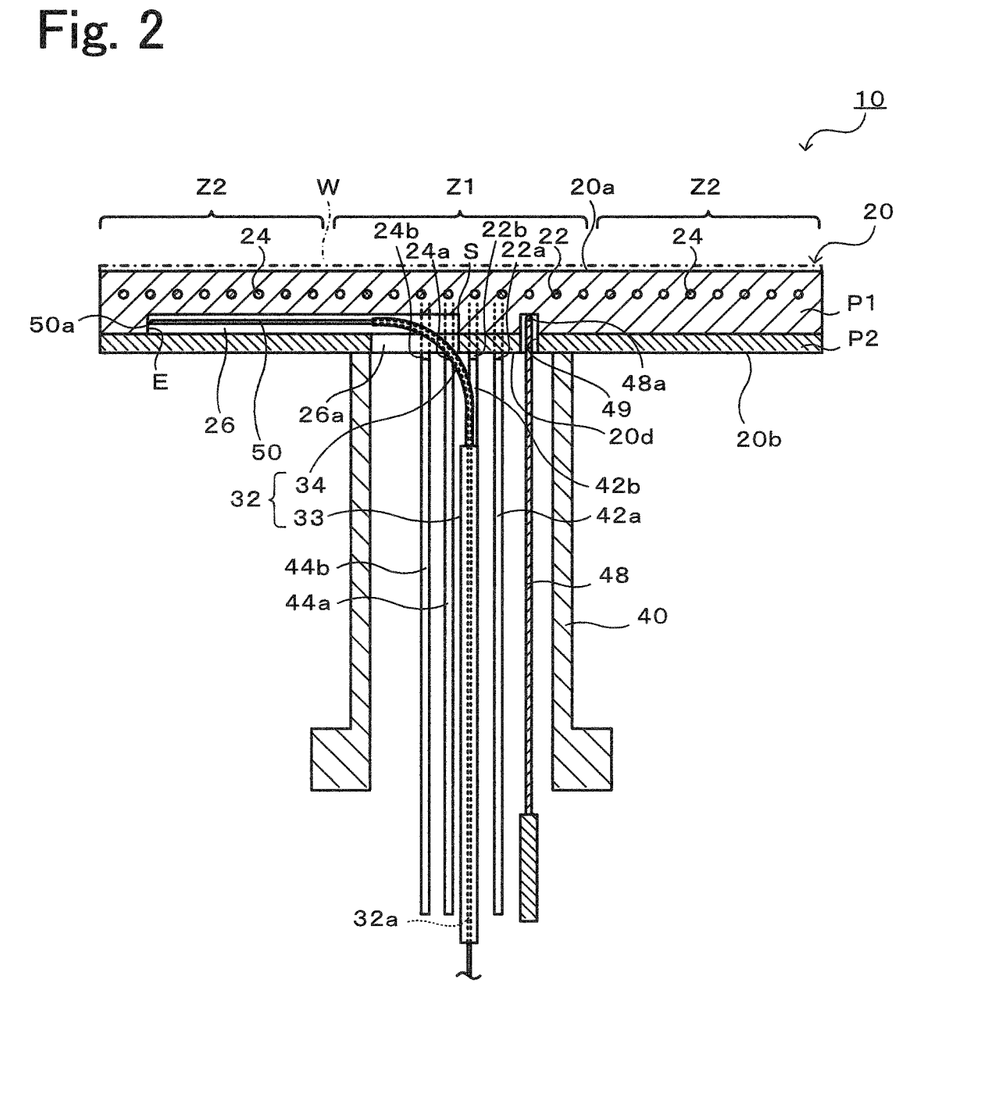
FIG. 2 is a cross-sectional view taken along A-A of FIG. 1.
Figure 3:
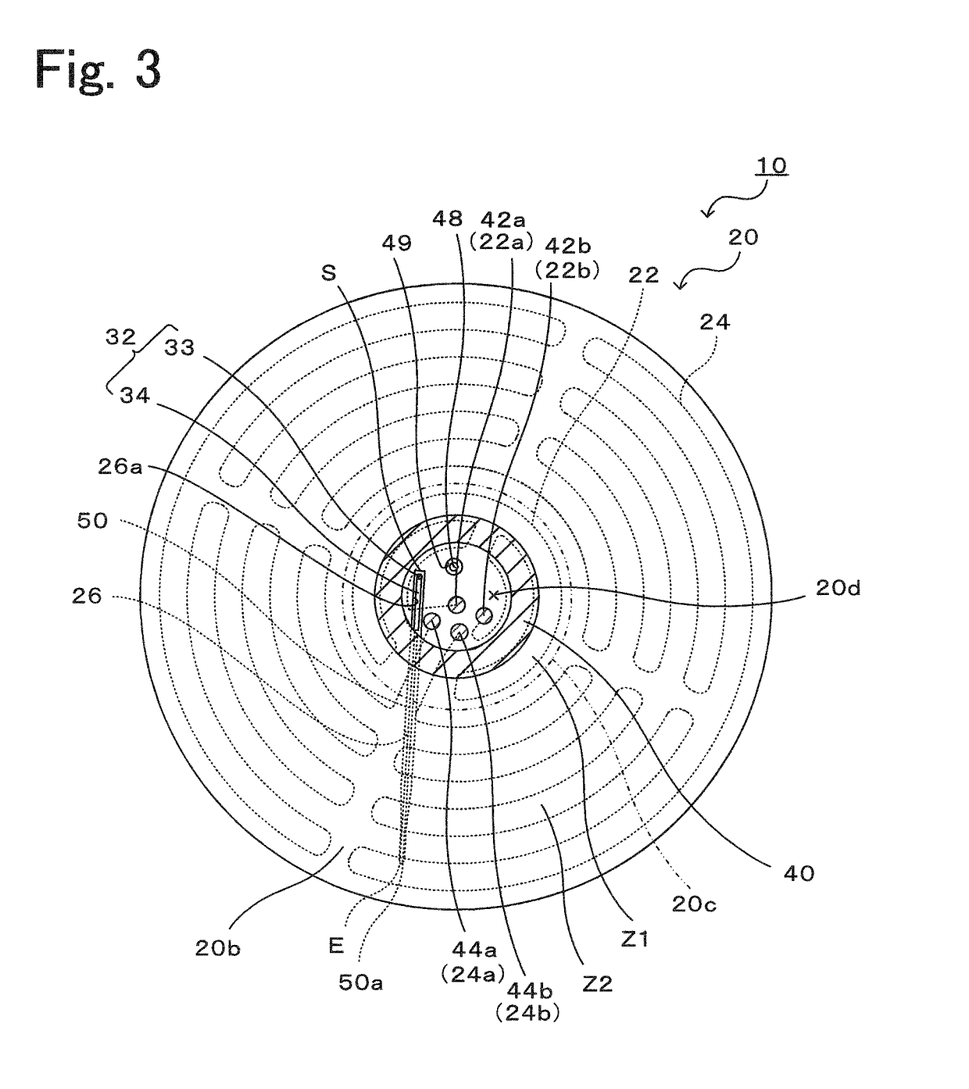
FIG. 3 is a cross-sectional view taken along B-B of FIG. 1.
Figure 4:
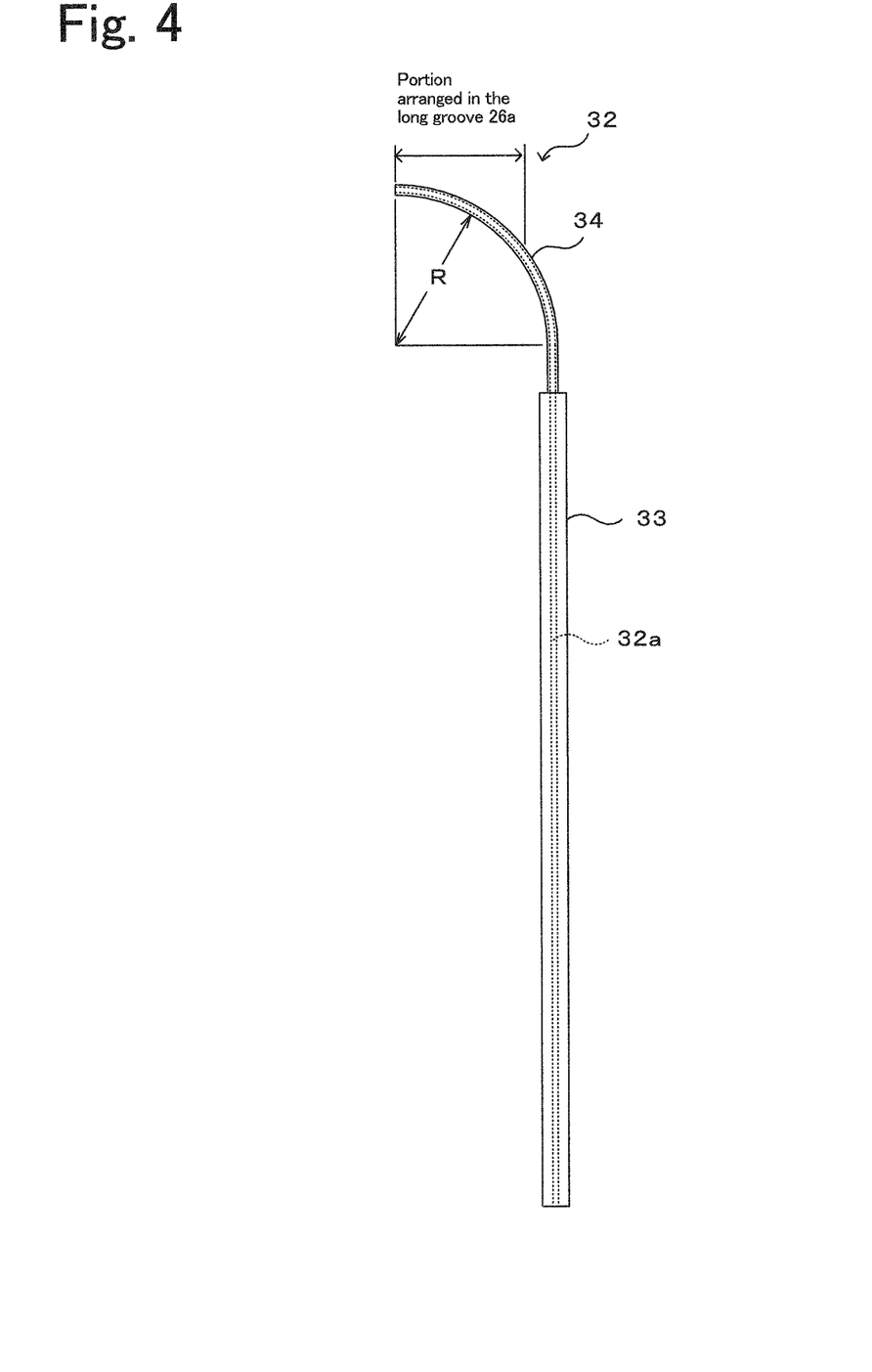
FIG. 4 is a front view of a thermocouple guide 32.
Figure 5:
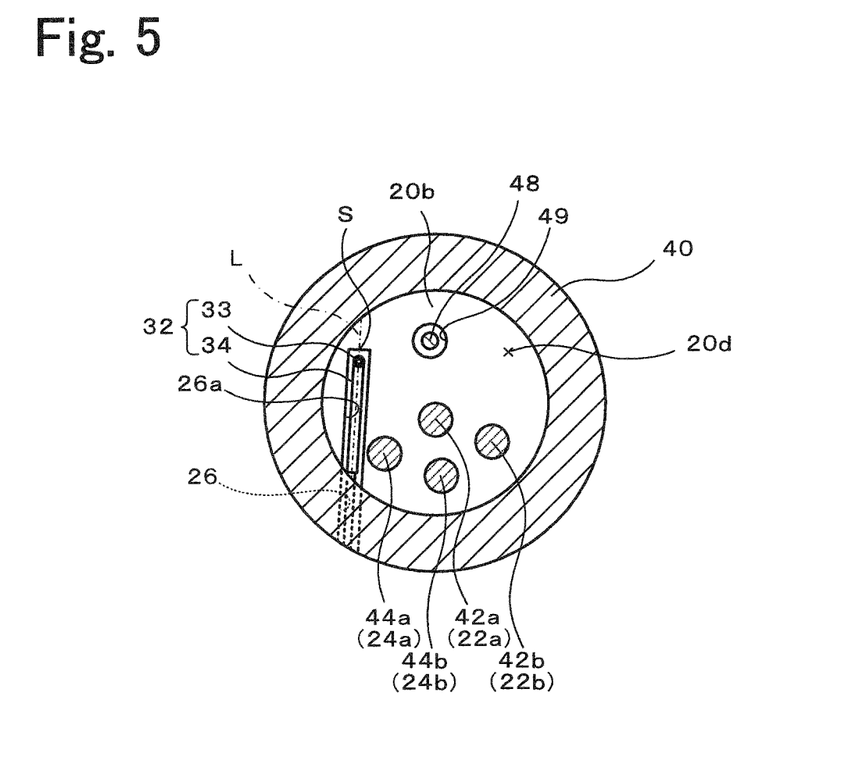
FIG. 5 is an enlarged view of a central portion of FIG. 3.

A preferred embodiment of the present invention will be described below with reference to the drawings. FIG. 1 is a perspective view of a ceramic heater 10, FIG. 2 is a cross-sectional view taken along A-A of FIG. 1, FIG. 3 is a cross-sectional view taken along B-B of FIG. 1, FIG. 4 is a front view of a thermocouple guide 32, and FIG. 5 is an enlarged view of a central portion of FIG. 3.

The ceramic heater 10 is used to heat a wafer which undergoes processing such as etching and CVD, and is installed in a vacuum chamber which is not illustrated. The ceramic heater 10 includes a disc-shaped ceramic plate 20 having a wafer mounting surface 20a, and a cylindrical shaft 40 joined to the surface (rear surface) 20b on the opposite side of the wafer mounting surface 20a of the ceramic plate 20.

The ceramic plate 20 is a disc-shaped plate comprised of a ceramic material represented by aluminum nitride or alumina. The diameter of the ceramic plate 20 is not particularly limited, and is approximately 300 mm, for instance. The ceramic plate 20 is divided into a small circular inner circumferential side zone Z1 and a circular ring-shaped outer circumferential side zone Z2 by a virtual boundary 20c (see FIG. 3) concentric with the ceramic plate 20. An inner circumferential side resistance heating element 22 is embedded in the inner circumferential side zone Z1 of the ceramic plate 20, and an outer circumferential side resistance heating element 24 is embedded in the outer circumferential side zone Z2. Both resistance heating elements 22, 24 are formed of a coil which has a major component of molybdenum, tungsten, or tungsten carbide, for instance. As illustrated in FIG. 2, the ceramic plate 20 is produced by surface bonding an upper side plate P1 and a lower side plate P2 which is thinner than the upper side plate P1.

Like the ceramic plate 20, the cylindrical shaft 40 is comprised of ceramics such as aluminum nitride or alumina. The upper end of the cylindrical shaft 40 is diffusion bonded to the ceramic plate 20.

As illustrated in FIG. 3, the inner circumferential side resistance heating element 22 is formed so as to start from one of a pair of terminals 22a, 22b, to be wired on substantially the entire area of the inner circumferential side zone Z1 while being folded back at multiple fold-back portions in a traversable manner, and to arrive at the other of the pair of terminals 22a, 22b. The pair of terminals 22a, 22b are provided in the area (shaft inside area) 20d inwardly of the cylindrical shaft 40 of the rear surface 20b of the ceramic plate 20. The pair of terminals 22a, 22b are respectively joined to power feeding rods 42a, 42b made of metal (for instance, made of Ni). It is to be noted that power feeding rods 42a, 42b are inserted in an insulating tube which is not illustrated.

As illustrated in FIG. 3, the outer circumferential side resistance heating element 24 is formed so as to start from one of a pair of terminals 24a, 24b, to be wired on substantially the entire area of the outer circumferential side zone Z2 while being folded back at multiple fold-back portions in a traversable manner, and to arrive at the other of the pair of terminals 24a, 24b. The pair of terminals 24a, 24b are provided in the shaft inside area 20d of the rear surface 20b of the ceramic plate 20. The pair of terminals 24a, 24b are respectively joined to power feeding rods 44a, 44b made of metal (for instance, made of Ni). It is to be noted that power feeding rods 44a, 44b are inserted in an insulating tube which is not illustrated.

As illustrated in FIG. 2, the inside of the ceramic plate 20 is provided with a long hole 26 for inserting an outer circumferential side thermocouple 50 and in parallel to the wafer mounting surface 20a. The long hole 26 extends from a start point S in the shaft inside area 20d of the rear surface 20b of the ceramic plate 20 to a terminal position E of the outer circumferential portion of the ceramic plate 20 along a direction deviated from the diameter direction of the ceramic plate 20. A portion of the long hole 26 forms a long groove 26a to arrange the leading end of a curved portion 34 of the thermocouple guide 32, the portion passing through the shaft inside area 20d. The long groove 26a is open to the internal space of the cylindrical shaft 40.

Figure 6:
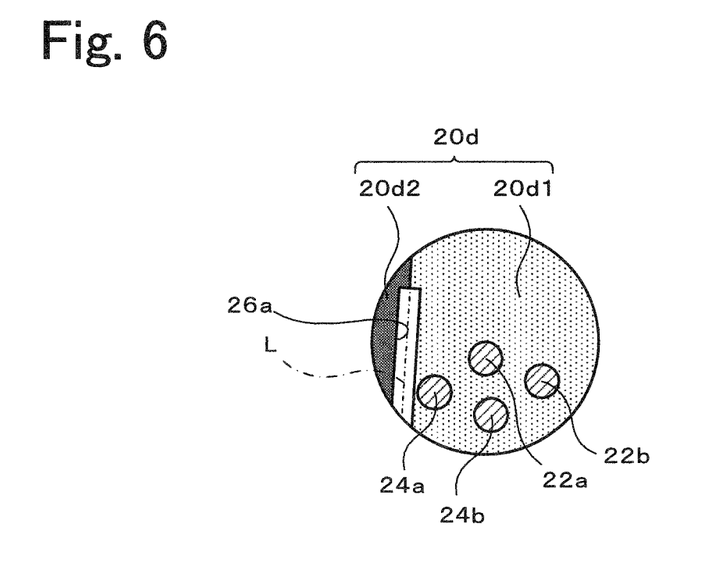
FIG. 6 is an explanatory view of arrangement positions of terminals 22a, 22b, 24a, 24b.

Here, the arrangement positions of the terminals 22a, 22b, 24a, 24b will be described using FIG. 6. The shaft inside area 20d is divided into first and second division areas 20d1, 20d2 by an axial line L (which is the same as the axial line of the long hole 26, and is a line in a direction deviated from the diameter direction of the ceramic plate 20) of the long groove 26a. In FIG. 6, the first division area 20d1 is illustrated by rough hatching, and the second division area 20d2 is illustrated by fine hatching. The area of the first division area 20d1 is larger than the area of the second division area 20d2. The terminals 22a, 22b, 24a, 24b are collectively provided in the first division area 20d1 (excluding the long groove 26a) having a larger area. Also, each of the terminals 22a, 22b, 24a, 24b is arranged at a position where an electrical insulating property can be maintained.

As illustrated in FIG. 4, the thermocouple guide 32 is a cylindrical metal (for instance, stainless-steel) member including a guide hole 32a. The thermocouple guide 32 includes a vertical portion 33 extending in the vertical direction with respect to the wafer mounting surface 20a, and the curved portion 34 which changes its direction from the vertical direction to the horizontal direction. Although the outer diameter of the vertical portion 33 is larger than the outer diameter of the curved portion 34, the inner diameter of the vertical portion 33 is the same as the inner diameter of the curved portion 34. The outer diameter of the curved portion 34 is made smaller in this manner, thus the width of the long groove 26a in which the curved portion 34 is inserted can be decreased. However, the outer diameter of the vertical portion 33 may be the same as the outer diameter of the curved portion 34. The curvature radius R of the curved portion 34 is not particularly limited, however, is approximately 30 mm, for instance. The outer circumferential side thermocouple 50 is inserted in the guide hole 32a of the thermocouple guide 32 (see FIG. 2). The leading end of the curved portion 34 may be simply inserted in the long groove 26a, or may be internally joined or bonded to the long groove 26a. It is to be noted that the thermocouple guide 32 may be comprised of an electrical insulating material such as ceramics.

As illustrated in FIG. 2, inside the cylindrical shaft 40, the power feeding rods 42a, 42b respectively connected to the pair of terminals 22a, 22b of the inner circumferential side resistance heating element 22, and the power feeding rods 44a, 44b respectively connected to the pair of terminals 24a, 24b of the outer circumferential side resistance heating element 24 are disposed. Inside the cylindrical shaft 40, an inner circumferential side thermocouple 48 for measuring the temperature in the vicinity of the center of the ceramic plate 20, and an outer circumferential side thermocouple 50 for measuring the temperature in the vicinity of the outer circumference of the ceramic plate 20 are also arranged. The inner circumferential side thermocouple 48 is inserted in a recessed portion 49 provided in the rear surface 20b of the ceramic plate 20, and a temperature sensing part 48a at the leading end is in contact with the ceramic plate 20. The recessed portion 49 is provided at a position which does not interfere with the terminals 22a, 22b, 24a, 24b, and the long groove 26a. The outer circumferential side thermocouple 50 is a sheath thermocouple, which penetrates the guide hole 32a of the thermocouple guide 32 and the long hole 26, and a temperature sensing part 50a at the leading end reaches the terminal position E of the long hole 26.

Next, an example of use of the ceramic heater 10 will be described. First, the ceramic heater 10 is installed in a vacuum chamber which is not illustrated, and a wafer W is mounted on the wafer mounting surface 20a of the ceramic heater 10. The electric power supplied to the inner circumferential side resistance heating element 22 is adjusted so that the temperature detected by the inner circumferential side thermocouple 48 becomes a predetermined target inner circumferential side temperature, and the electric power supplied to the outer circumferential side resistance heating element 24 is adjusted so that the temperature detected by the outer circumferential side thermocouple 50 becomes a predetermined target outer circumferential side temperature. Thereby, the temperature of the wafer W is controlled at a desired temperature. The inside of the vacuum chamber is set to a vacuum atmosphere or a reduced-pressure atmosphere to generate plasma in the vacuum chamber, and CVD film formation is performed or etching is performed on the wafer W utilizing the plasma.

In the ceramic heater 10 of the present embodiment described above, the first and second division areas 20d1, 20d2 are divided by the axial line L (which is the same as the axial line of the long hole 26) of the long groove 26a. The axial line L is a line in a direction deviated from the diameter direction of the ceramic plate 20. Therefore, the first division area 20d1 which is one division area is larger in area than the second division area 20d2 which is the other. Here, the terminals 22a, 22b, 24a, 24b are collectively provided in the first division area 20d1 having a larger area. Consequently, in a multi-zone heater to which the thermocouple guide 32 can be attached, it is possible to collectively arrange the attached components including the multiple terminals 22a, 22b, 24a, 24b and increase the degree of freedom of the arrangement. It is to be noted that wires from the terminals 22a, 22b, 24a, 24b to an external device are easily bundled by collectively providing the terminals 22a, 22b, 24a, 24b. In this case, the attached components, such as the inner side thermocouple 48, other than the terminals 22a, 22b, 24a, 24b which supply electrical power to the resistance heating elements 22, 24 is not present in the area surrounded by the terminals 22a, 22b, 24a, 24b.

Also, at the time of manufacturing the ceramic heater 10, when a procedure is adopted, in which the power feeding rods 42a, 42b, 44a, 44b are respectively connected to the terminals 22a, 22b, 24a, 24b exposed to the rear surface 20b of the ceramic plate 20 to connect the cylindrical shaft 40 to the rear surface 20b, then the thermocouple guide 32 is mounted, the thermocouple guide 32 does not need to be passed between the power feeding rods, thus the mounting is easy.

In addition, since the attached components such as the terminals 22a, 22b, 24a, 24b are collectively provided in the first division area 20d1 having a larger area, these attached components can be easily arranged at positions where an electrical insulating property can be maintained.

Furthermore, the length of the long groove 26a serving as the entrance portion of the long hole 26 is set to be longer than or equal to the length of the leading portion, arranged in the long groove 26a, of the curved portion 34 of the thermocouple guide 32. Therefore, the thermocouple guide 32 can be set more easily.

The outer diameter of the curved portion 34 of the thermocouple guide 32 is made less than the outer diameter of the vertical portion 33, thus the width of the long groove 26a can be decreased.

The present invention is not limited to the embodiment described above, and needless to say, the present invention can be implemented in various manners as long as not departing from the technical scope of the present invention.

Figure 7:
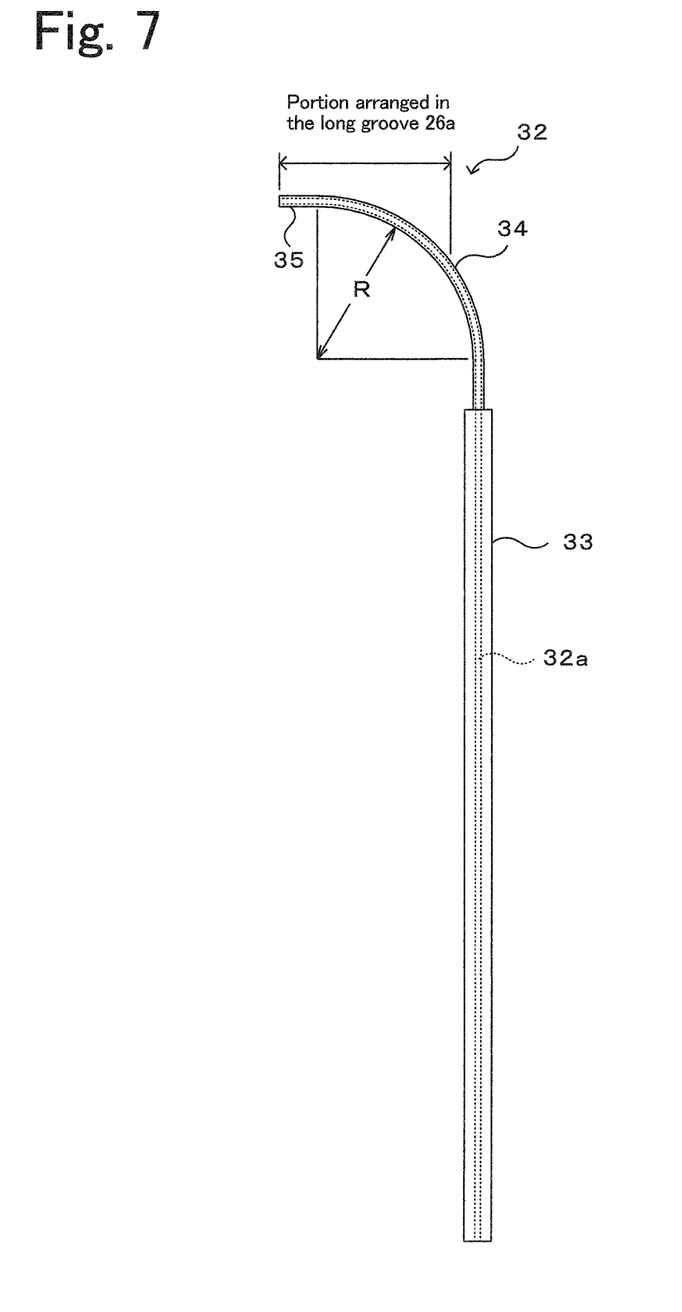
FIG. 7 is a front view of another example of the thermocouple guide 32.

For instance, in the above-described embodiment, as illustrated in FIG. 7, the thermocouple guide 32 may include a horizontal portion 35 which connects to the outlet of the curved portion 34 and extends in a direction horizontal to the wafer mounting surface 20a. In this manner, the outer circumferential side thermocouple 50 can be guided to the long hole 26 more smoothly. In addition, the thermocouple guide 32 having such a horizontal portion 35 has a long portion arranged in the long groove 26a. Thus, it is preferable that the length of the long groove 26a be set accordingly.

Figure 8:
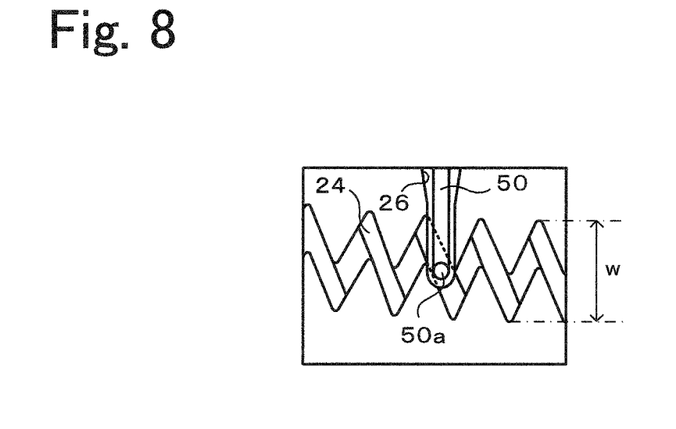
FIG. 8 is an explanatory view illustrating an example of a position of a temperature sensing part 50a of an outer circumferential side thermocouple 50.

In the embodiment described above, as illustrated in FIG. 8, the temperature sensing part 50a of the outer circumferential side thermocouple 50 in the long hole 26 may be arranged to fall within the width (specifically, the width w of the coil) of the outer circumferential side resistance heating element 24 when viewed from the rear surface 20b. When the outer circumferential side resistance heating element 24 is not in a coil shape but in a ribbon shape (elongated flat plate shape), the temperature sensing part 50a may be arranged to fall within the width of the ribbon. In this manner, a temperature change in the outer circumferential side resistance heating element 24 can be detected with a good response by the temperature sensing part 50a of the outer circumferential side thermocouple 50.

In the above-described embodiment, both the resistance heating elements 22, 24 are coil-shaped, but are not particularly limited to coil-shaped, and may be, for instance, a print pattern, and may be in a ribbon shape or a mesh shape.

In the above-described embodiment, an electrostatic electrode or an RF electrode may be built in by adding the resistance heating elements 22, 24 to the ceramic plate 20. When an electrostatic electrode is built in, the first division area 20d1 of the ceramic plate 20 is provided with the terminal (one of the attached components) of the electrostatic electrode. When an RF electrode is built in, the first division area 20d1 of the ceramic plate 20 is provided with the terminal (one of attached components) of the RF electrode.

In the above-described embodiment, the vertical length of the thermocouple guide 32 is substantially the same as the height of the cylindrical shaft 40. However, the vertical length may be shorter or longer than the height of the cylindrical shaft 40.

In the above-described embodiment, the inner circumferential side zone Z1 may be divided into multiple inner circumferential side small zones, and a resistance heating element may be drawn through each of the inner circumferential side small zones in a traversable manner. Also, the outer circumferential side zone Z2 may be divided into multiple outer circumferential side small zones, and a resistance heating element may be drawn through each of the outer circumferential side small zones in a traversable manner. Although the number of terminals increased according to the number of small zones, these terminals are collectively provided in the first division area 20d1 having a larger area, thus can be relatively easily arranged even if the number of the terminals is increased.

In the embodiment described above, a procedure has been illustrated, in which the power feeding rods 42a, 42b, 44a, 44b are respectively connected to the terminals 22a, 22b, 24a, 24b of the ceramic plate 20 to connect the cylindrical shaft 40 to the rear surface 20b of the ceramic plate 20, then the thermocouple guide 32 is mounted. However, the mounting procedure is not limited to this. For instance, the cylindrical shaft 40 is connected to the rear surface 20b of the ceramic plate 20, the thermocouple guide 32 is mounted, then the power feeding rods 42a, 42b, 44a, 44b may be respectively connected to the terminals 22a, 22b, 24a, 24b.

Figure 9:
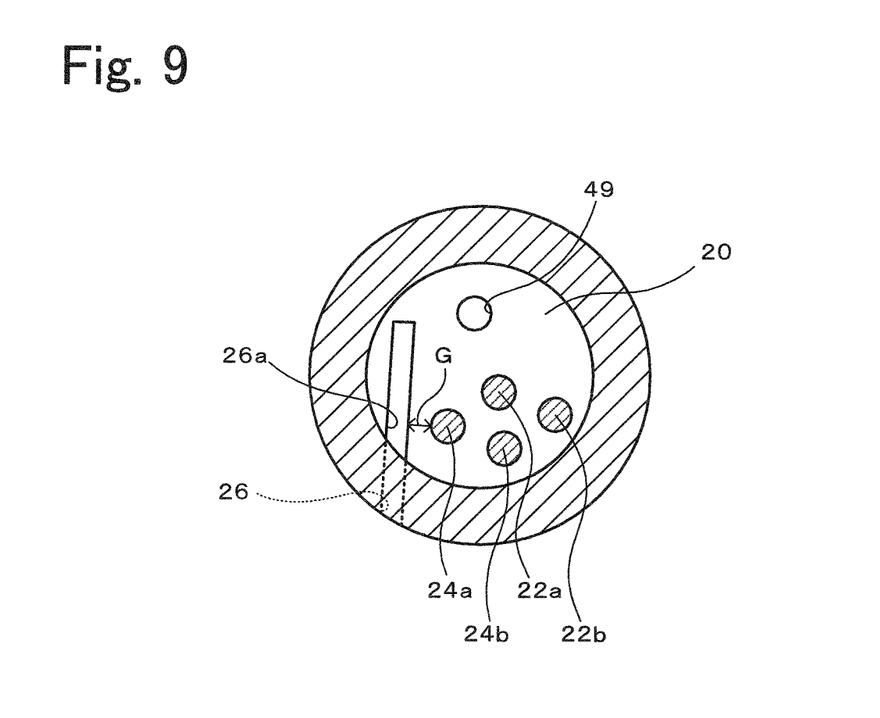
FIG. 9 is an explanatory view illustrating a gap G between a long groove 26a and each of the attached components.

In the above-described embodiment, as illustrated in FIG. 9, the gap G between the long groove 26a and each of the attached components (terminals 22a, 22b, 24a, 24b and the recessed portion 49) is preferably greater than or equal to 2 mm. In this manner, it is possible to prevent the occurrence of crack in the ceramic plate 20 due to a narrow gap between the long groove 26a and each of the attached components.

The present application claims priority from JP Patent Application No. 2018-238225 filed Dec. 20, 2018, the entire contents of which are incorporated herein by reference.

What is claimed is:

1. A ceramic heater comprising:
   a disc-shaped ceramic plate having a wafer mounting surface, the disc-shaped ceramic plate being divided into small inner circumferential side zone and a circular ring-shaped outer circumferential side zone;
   a cylindrical shaft connected to a rear surface of the ceramic plate, the rear surface being on an opposite side of the wafer mounting surface;
   an inner circumferential side resistance heating element which is embedded in the small inner circumferential size zone of the ceramic plate;
   an outer circumferential side resistance heating element which is embedded in the circular ring-shaped outer circumferential side zone of the ceramic plate;
   a shaft inside area which is of the rear surface of the ceramic plate and inside of the cylindrical shaft;
   a hole which is provided along a direction deviated from a diameter direction of the ceramic plate and extends from the shaft inside area to a predetermined position of the circular ring-shaped outer circumferential side zone of the ceramic plate; and
   attached components which are provided in the shaft inside area and include a pair of terminals of the inner circumferential side resistance heating element and a pair of terminals of the outer circumferential side resistance heating element,
   wherein a portion of the hole forms a groove, the portion of the hole forming the groove passing through the shaft inside area,
   the attached components are collectively provided in one of two division areas which are in the shaft inside area and divided by an axial line of the groove, the one having a larger area, and
   wherein the entire groove is linear in a cross-sectional view and a plan view.

2. The ceramic heater according to claim 1,
   wherein of the attached components, any attached components other than the terminals of the inner circumferential side and outer circumferential side resistance heating elements is not present in an area surrounded by the terminals of the inner circumferential side and outer circumferential side resistance heating elements.

3. The ceramic heater according to claim 1,
   wherein the hole is a thermocouple insertion hole in which a thermocouple is inserted.

4. The ceramic heater according to claim 1,
   wherein the groove is used to arrange a cylindrical thermocouple guide having a curved portion configured to change a direction from a vertical direction to a horizontal direction with respect to the wafer mounting surface.

5. The ceramic heater according to claim 4,
   wherein a length of the groove is defined to be longer than or equal to a length of a leading end portion of the curved portion of the thermocouple guide, the leading end portion being disposed in the groove.

6. The ceramic heater according to claim 5,
   wherein an outer diameter of the curved portion of the thermocouple guide is smaller than an outer diameter of the vertical portion.

7. The ceramic heater according to claim 4, further comprising
the thermocouple guide arranged in the long groove.

8. The ceramic heater according to claim 7, further comprising
a thermocouple inserted in the thermocouple guide and the-tong hole.

9. The ceramic heater according to claim 8,
wherein a temperature sensing part of the thermocouple guide is arranged to fall within a width of the outer circumferential side resistance heating element when the ceramic plate is viewed from the rear surface.

10. The ceramic heater according to claim 1,
wherein a gap between the-tong groove and each of the attached components is 2 mm or greater.

* * * * *